(12) United States Patent
Sun

(10) Patent No.: US 6,476,675 B1
(45) Date of Patent: Nov. 5, 2002

(54) DOUBLE-CASCODE TWO-STAGE OPERATIONAL AMPLIFIER

(75) Inventor: Runhua Sun, Tustin, CA (US)

(73) Assignee: GlobespanVirata, Inc., Red Bank, NJ (US)

( * ) Notice: Subject to any disclaimer, the term of this patent is extended or adjusted under 35 U.S.C. 154(b) by 119 days.

(21) Appl. No.: 09/747,470

(22) Filed: Dec. 20, 2000

Related U.S. Application Data

(60) Provisional application No. 60/224,601, filed on Aug. 11, 2000.

(51) Int. Cl.[7] .............................. H03F 3/45; H03F 3/04
(52) U.S. Cl. ........................ 330/253; 330/258; 330/310
(58) Field of Search ............................... 330/253, 258, 330/310

(56) References Cited

U.S. PATENT DOCUMENTS

| | | | |
|---|---|---|---|
| 5,541,555 A | * | 7/1996 | Pernici ........................ 330/253 |
| 5,847,607 A | * | 12/1998 | Lewicki et al. ............. 330/258 |
| 5,856,757 A | * | 1/1999 | Eschauzier ................... 327/552 |
| 6,353,361 B1 | * | 3/2002 | Sun .............................. 330/253 |

OTHER PUBLICATIONS

Kelvin Boo–Huat Khoo, "Programmable, High–Dynamic Range Sigma–Delta A/D Converters for Multistandard, Fully–Integrated RF Receivers," Dec. 1998, pp. 54–69.

* cited by examiner

*Primary Examiner*—Patricia T. Nguyen
(74) *Attorney, Agent, or Firm*—Thomas, Kayden, Horstemeyer & Risley

(57) ABSTRACT

A two-stage op-amp circuit including a double-cascode telescopic op-amp circuit in the input stage and a fully-differential op-amp circuit in the output stage and having very high open-loop DC gain, very high unity-gain frequency, and relatively very low power consumption is presented. The input stage op-amp circuit and the output stage op-amp circuit are each comprised of a plurality of electrically connected MOSFET's. The input stage op-amp circuit provides very high gain, high input resistance, and large common mode rejection. The output stage op-amp circuit provides gain, low output resistance, and minimal output loss.

6 Claims, 2 Drawing Sheets

DOUBLE-CASCODE TWO-STAGE OPERATIONAL AMPLIFIER

CROSS-REFERENCE TO RELATED APPLICATION

The present application claims the benefit of co-pending U.S. provisional patent application, issued Serial No. 60/224,601, and filed Aug. 11, 2000, which is hereby incorporated by reference in its entirety.

FIELD OF THE INVENTION

The present invention generally relates to integrated circuit ("IC") operational amplifiers. More specifically, the invention relates to cascode, two-stage operational amplifiers.

BACKGROUND OF THE INVENTION

Since the development of the transistor and integrated circuits, IC operational amplifiers ("op-amps") have been used in many applications related to such fields as telecommunications, audio/video technology, and computers. Complementary metal oxide semiconductor ("CMOS") operational amplifiers are a major category of IC op-amps that are used in a variety of applications. For example, CMOS op-amps are widely applied in high performance CMOS circuits, such as high speed/high resolution pipeline analog-to-digital ("A/D") converters.

In the application of op-amps, such as CMOS op-amps, the performance of the overall circuit is typically limited by the performance capability of the op-amp(s) used in the circuit. For example, the dynamic range performance and frequency response performance of a circuit using an op-amp are generally limited based on the open-loop DC gain and unity-gain frequency of the op-amp. High performance circuits require op-amps with high open-loop DC gain and a high unity-gain frequency.

There have been continuous efforts made to develop op-amps with higher open-loop DC gain and a higher unity-gain frequency to support the development of increasingly higher performing circuits. Typically, in this regard, there are prominent trade-offs that occur in op-amp performance. For example, an increase in gain performance typically results in an undesired decrease in frequency response performance. As another example, an increase in speed/unity-gain frequency typically results in the undesired increase of power consumption.

Various op-amp designs have been developed in an attempt to meet high performance requirements while minimizing performance trade-offs. These designs include folded-cascode op-amps with gain boosting and two-stage op-amps. Designs denoted by these names are known in the art, and need not be described herein. Yet, such designs have not been shown to fulfil the increasing demand for even higher performance applications. Thus, there is a need for an operational amplifier that performs with very high open-loop DC gain while maintaining a very high unity-gain frequency, in comparison to existing designs, but without significant increase of undesired parameters.

SUMMARY OF THE INVENTION

Certain objects, advantages, and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve various objects and advantages, the present invention is directed to a novel op-amp circuit. In accordance with a preferred embodiment of the present invention, a two-stage op-amp circuit including a double-cascode telescopic op-amp circuit in the input stage and a fully-differential op-amp circuit in the output stage is provided.

One advantage of a preferred embodiment of the present invention is that it performs with a very high open-loop DC gain in comparison to existing op-amp circuits. Another advantage of a preferred embodiment of the present invention is that its significant increase in open-loop DC gain does not result in a decrease in its unity-gain frequency, as typically occurs in existing op-amp circuits. That is, a preferred embodiment of the present invention performs with a very high open-loop DC gain while also maintaining a very high unity-gain frequency. Yet another advantage of a preferred embodiment of the present invention is that, considering its very high open-loop DC gain and very high unity-gain frequency performance, it has no increase in power consumption and a significantly small increase in other undesirable operation parameters in comparison to existing op-amp circuits.

Other objects, features, and advantages of the present invention will become apparent to one skilled in the art upon examination of the following drawings and detailed description. It is intended that all such additional objects, features, and advantages be included herein within the scope of the present invention, as defined by the claims.

BRIEF DESCRIPTION OF THE DRAWINGS

The present invention will be more fully understood from the detailed description given below and from the accompanying drawings of a preferred embodiment of the invention, which however, should not be taken to limit the invention to the specific embodiments enumerated, but are for explanation and for better understanding only. Furthermore, the drawings are not necessarily to scale, emphasis instead being placed upon clearly illustrating the principles of the invention. Finally, like reference numerals in the figures designate corresponding parts throughout the several drawings.

DETAILED DESCRIPTION OF THE PREFERRED EMBODIMENTS

Figure 1:
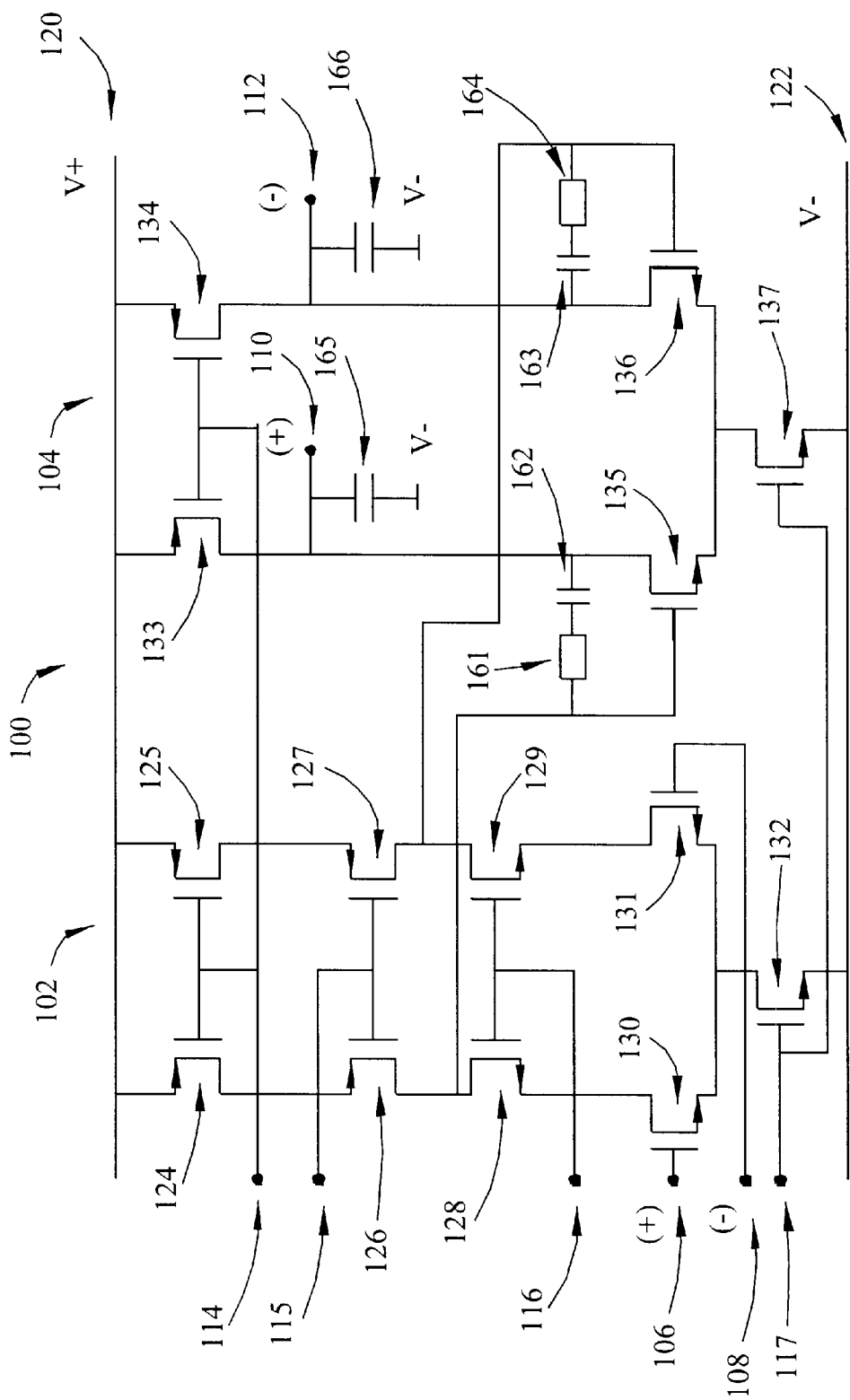
FIG. 1 is a circuit diagram illustrating a conventional two-stage op-amp using a telescopic op-amp circuit in the input stage and a fully-differential op-amp circuit in the output stage, as is known in the prior art.

Having summarized the invention above, reference is now made in detail to the description of the invention as illustrated in the drawings. While the invention will be described in connection with these drawings, there is no intent to limit it to the embodiment or embodiments disclosed therein. On the contrary, the intent is to cover all alternatives, modifications, and equivalents included within the spirit and scope of the invention as defined by the appended claims. Indeed, the present invention is believed to be applicable to a variety of systems, devices, and technologies.

Turning now to the drawings, wherein like referenced numerals designate corresponding parts throughout the drawings, FIG. 1 shows a conventional two-stage op-amp circuit 100, as is known in the prior art. Such a circuit includes a positive (i.e., noninverting) input 106 and a negative (i.e., inverting) input 108 electrically connected to the first stage 102. A positive (i.e., noninverting) output 110 and a negative (i.e., inverting) output 112 are electrically connected to the second stage 104 of such a circuit and a load capacitor (165, 166) is electrically connected to each of these outputs.

The first stage 102 of the op-amp 100 consists of what is commonly referred to in the art as a telescopic op-amp configuration, which is made up of a plurality of metal-oxide semiconductor field-effect transistors ("MOSFET's") (124–132) that are electrically connected. The first stage 102 functions to provide gain, that is to amplify the input signal, and also to provide high input resistance and large common mode rejection. The second stage 104 of the op-amp 100 consist of what is commonly referred to in the art as a fully-differential op-amp configuration, which is made up of a plurality of MOSFET's (133–137) that are electrically connected, as shown. The second stage 104 functions to also provide gain and to provide a low output resistance and minimal output signal loss. Electrically interconnecting the first stage 102 and the second stage 104 are coupling resistors (161, 164) and coupling capacitors (162, 163).

The op-amp 100 is powered from a positive voltage power rail 120 and a negative voltage power rail 122. Additionally, various members (124–129, 132–134, 137) of the plurality of MOSFET's, which make up the two stages (102, 104) of the op-amp circuit 100, are biased via bias inputs (114–117). Essentially, the conventional op-amp circuit 100 operates to output an amplified version of an input signal that has a frequency within the operating bandwidth of the op-amp 100. The op-amp 100 utilizes Miller compensation to maintain stability, as is known in the art.

Having described a conventional two-stage op-amp circuit, as is known in the prior art, reference now will be made to various embodiments of a fully-differential two-stage op-amp with gain-boosting in the first stage, constructed in accordance with various aspects of the present invention. To this end, reference is first made to FIG. 2, which shows a circuit diagram of a two-stage op-amp 200 using a double-cascode telescopic op-amp in the input stage and a fully-differential op-amp circuit in the output stage, in accordance with a preferred embodiment of the present invention. Where appropriate, reference numerals have been kept the same as those illustrated in connection with FIG. 1 to emphasize the differences in a preferred embodiment of the present invention from the prior art circuit.

Figure 2:
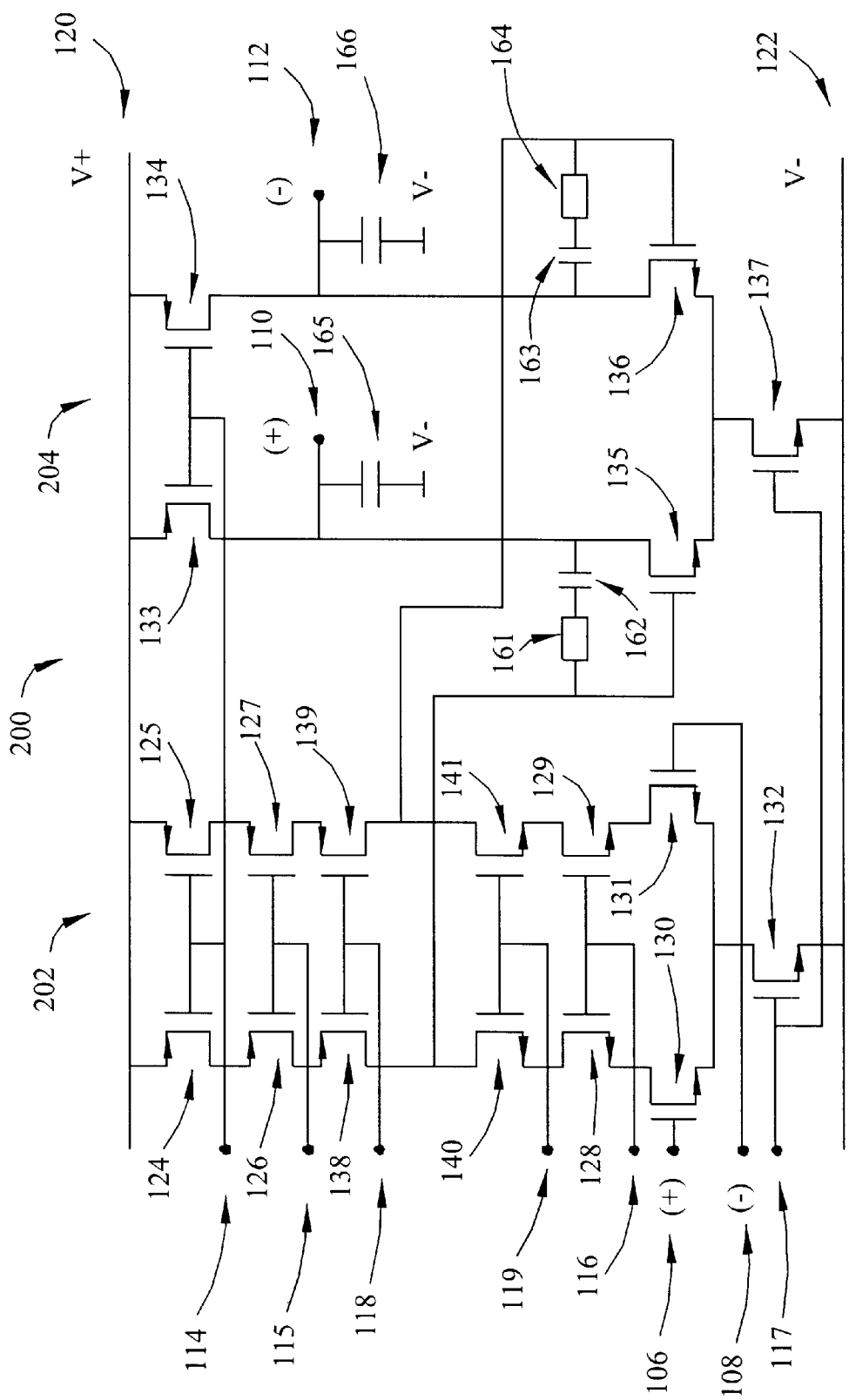
FIG. 2 is a circuit diagram of a two-stage op-amp using a double-cascode telescopic op-amp circuit in the input stage and a fully-differential op-amp circuit in the output stage, in accordance with a preferred embodiment of the present invention.

Referring to FIG. 2, the op-amp 200 of the present invention comprises a positive input 106 and a negative input 108 which are electrically connected to an input stage 202. The op-amp 200 also comprises a positive output 110 and a negative output 112 which are electrically connected to an output stage 204. In a preferred embodiment, as shown in FIG. 2, each output (110, 112) is also electrically connected to a load capacitor (165, 166), although in other embodiments, these load capacitors may not be included. An input or output, as it is referred to in the present invention, may include but is not limited to any thing that may be used as an electrical connector or connection, for example, a terminal, pin, contact, lead, or solder point. The input stage 202 and output stage 204 are electrically coupled, and in a preferred embodiment, as shown in FIG. 2, the input stage 202 and the output stage 204 are electrically interconnected by circuits that each have a coupling resistor (161, 164) and a coupling capacitor (162, 163). Additionally, the op-amp 200 is powered from a positive voltage power rail 120 and a negative voltage power rail 122.

The input stage 202 comprises a plurality of MOSFET's (124–132, 138–141) that are electrically connected in a double-cascode telescopic op-amp configuration. The double-cascode configuration and the telescopic configuration are commonly referred to op-amp configurations in the art. The output stage 204 comprises a plurality of MOSFET's (133–137) that are electrically connected in what is commonly referred to in the art as a fully-differential op-amp configuration. The op-amp 200 has members (124–129, 132–34, 137–141) of the plurality of MOSFET's of the input and output stages (202, 204) that are electrically connected to and biased through bias inputs (114–119). In contrast to the conventional op-amp 100 (FIG. 1), the op-amp 200 of the present invention (FIG. 2) includes the additional MOSFET's (138–141) that transform the basic telescopic configuration of the conventional op-amp 100 to the double-cascode telescopic configuration of the present invention. Further, in contrast to the conventional op-amp 100 (FIG. 1), the additional MOSFET's (138–141) of the op-amp 200 (FIG. 2) of the present invention are biased through the additional bias inputs (118–119).

In the present invention, the input stage 202 functions to provide very high gain and also to provide high input resistance and large common mode rejection. Furthermore, the output stage 204 of the present invention functions to provide additional gain and to provide a low output resistance and minimal output signal loss.

As a result of the double-cascode telescopic configuration in the input stage of the op-amp 200, several notable benefits, among others, are achieved over the conventional op-amp 100. First, the open-loop DC gain of the op-amp 200 (FIG. 2) is significantly increased over that of the conventional op-amp 100 (FIG. 1). Second, the op-amp 200 achieves this significant increase in open-loop DC gain without a resultant decrease in its unity-gain frequency, unlike in the conventional op-amp 100 which typically incurs a decrease in unity-gain frequency for an attempted increase in open-loop DC gain. Third, the op-amp 200 achieves very high open-loop DC gain and maintains very high unity-gain frequency with no additional power consumption in comparison to the conventional op-amp 100. Additionally, the op-amp 200 achieves these benefits while avoiding the complex stability issue of the pole-zero doublet that occurs with the use of active gain-boosting circuits in the op-amp design.

It is emphasized that the above-described embodiments of the present invention, particularly any "preferred" embodiments, are merely possible examples of the implementations that are merely set forth for a clear understanding of the principles of the invention. It will be apparent to those skilled in the art that many modifications and variations may be made to the above-disclosed embodiments of the present invention without departing substantially from the spirit and principles of the invention. All such modifications and variations are intended to be included herein within the scope of the disclosure and present invention and protected by the following claims.

Therefore, having thus described the invention, at least the following is claimed:

1. An operational amplifier comprising:

an input stage comprising a first plurality of metal-oxide semiconductor field-effect transistors electrically connected in a double-cascode telescopic operational amplifier configuration;

a positive input electrically connected to the input stage;

a negative input electrically connected to the input stage;

a first series circuit comprising a first coupling resistor and a first coupling capacitor electrically connected to the input stage;

a second series circuit comprising a second coupling resistor and a second coupling capacitor electrically connected to the input stage;

an output stage electrically connected to the first series circuit and to the second series circuit comprising a second plurality of metal-oxide semiconductor field-effect transistors electrically connected in a fully-differential operational amplifier configuration;

a positive output electrically connected to the output stage, wherein a first load capacitor is electrically connected to the positive output;

a negative output electrically connected to the output stage, wherein a second load capacitor is electrically connected to the negative output;

a first plurality of bias inputs electrically connected to the input stage; and a second plurality of bias inputs electrically connected to the input and output stages.

2. An operational amplifier comprising:

an input stage comprising a first plurality of metal-oxide semiconductor field-effect transistors electrically connected in a double-cascode telescopic operational amplifier configuration;

an output stage electrically coupled to the input stage and comprising a second plurality of metal-oxide semiconductor field-effect transistors electrically connected in a fully-differential operational amplifier configuration.

3. The operational amplifier of claim 2 wherein the output stage is electrically coupled to the input stage by a first circuit comprising a first coupling resistor and a first coupling capacitor and by a second circuit comprising a second coupling resistor and a second coupling capacitor.

4. The operational amplifier of claim 2 wherein a positive input and a negative input are electrically connected to the input stage, a positive output having a first load capacitor and a negative output having a second load capacitor are electrically connected to the output stage, a first plurality of bias inputs are electrically connected to the input stage, and a second plurality of bias inputs are electrically connected to the input stage and the output stage.

5. A method for providing an operational amplifier having a very high open-loop DC gain, a very high unity-gain frequency, and a relatively very low power consumption comprising the steps of:

providing an input stage having very high gain, high input resistance, and large common mode rejection and comprising a first plurality of metal-oxide semiconductor field-effect transistors configured in a double-cascode telescopic operational amplifier configuration; and providing an output stage electrically coupled to the input stage having gain, low output resistance, and a minimal output loss characteristic and comprising a second plurality of metal-oxide semiconductor field-effect transistors configured in a fully-differential operational amplifier configuration.

6. The method of claim 5, further comprising the step of coupling the output stage to the input stage through a first circuit comprising a first coupling resistor and a first coupling capacitor and through a second circuit comprising a second coupling resistor and a second coupling capacitor.

* * * * *